United States Patent
Hu et al.

(10) Patent No.: US 11,256,312 B2
(45) Date of Patent: Feb. 22, 2022

(54) SYSTEM AND METHOD FOR MANAGING POWER TO SERVER

(71) Applicant: HONGFUJIN PRECISION ELECTRONICS (TIANJIN) CO., LTD., Tianjin (CN)

(72) Inventors: Jin-Jia Hu, New Taipei (TW); Yu-Chi Tsai, New Taipei (TW)

(73) Assignee: HONGFUJIN PRECISION ELECTRONICS (TIANJIN) CO., LTD., Tianjin (CN)

(*) Notice: Subject to any disclaimer, the term of this patent is extended or adjusted under 35 U.S.C. 154(b) by 181 days.

(21) Appl. No.: 16/451,812

(22) Filed: Jun. 25, 2019

(65) Prior Publication Data
US 2020/0341526 A1 Oct. 29, 2020

(30) Foreign Application Priority Data
Apr. 26, 2019 (CN) .......................... 201910344576.2

(51) Int. Cl.
| | | |
|---|---|---|
| G06F 1/00 | (2006.01) | |
| G06F 1/26 | (2006.01) | |
| H05K 7/20 | (2006.01) | |
| G06F 1/28 | (2006.01) | |

(52) U.S. Cl.
CPC ................ *G06F 1/263* (2013.01); *G06F 1/28* (2013.01); *H05K 7/20* (2013.01)

(58) Field of Classification Search
CPC .................................... G06F 1/263; G06F 1/28
See application file for complete search history.

(56) References Cited

U.S. PATENT DOCUMENTS

| | | | | |
|---|---|---|---|---|
| 4,908,523 A | * | 3/1990 | Snowden | G06F 1/3228 307/43 |
| 6,522,191 B1 | * | 2/2003 | Cha | H02M 3/073 327/536 |
| 2003/0188208 A1 | | 10/2003 | Fung | |
| 2005/0083123 A1 | * | 4/2005 | Taylor | H03F 3/189 330/251 |
| 2015/0121104 A1 | | 4/2015 | Kinouchi | |
| 2016/0065001 A1 | * | 3/2016 | Yasukawa | H02J 1/10 307/64 |
| 2017/0160789 A1 | * | 6/2017 | Hance | G06F 1/3275 |

\* cited by examiner

*Primary Examiner* — Mohammed H Rehman
(74) *Attorney, Agent, or Firm* — ScienBiziP, P.C.

(57) ABSTRACT

A method for managing electrical power to a server or server system is used in a power management system. The power management system comprises a power module, a backup power module, and a server system, the method comprises setting the server system to operate under a first working mode and controlling initialization of a BMC by an initialization command. A specified pin of the BMC is measured for a logic low voltage level and the server system is set to operate under a second working mode if the specified pin of the BMC is at the logic low voltage level. In different modes, the manner of supplying power and the working parameters of the server system are adjusted.

8 Claims, 3 Drawing Sheets

SYSTEM AND METHOD FOR MANAGING POWER TO SERVER

FIELD

The subject matter herein generally relates to power supplies to a server.

BACKGROUND

A server system usually includes a power module, a backup power module, and servers. The servers are electrically connected to the power module and the backup power module. When the power module is not working correctly, the servers can work based on the backup power module. When being powered by the backup power module, the state of the backup power module cannot be monitored. The power capacity of the backup module is small, and the servers will be powered off when the backup power module is exhausted, risking data loss. The stability of a server system should be improved.

BRIEF DESCRIPTION OF THE FIGURES

Implementations of the present disclosure will be described, by way of example only, with reference to the figures.

DETAILED DESCRIPTION

Figure 1:
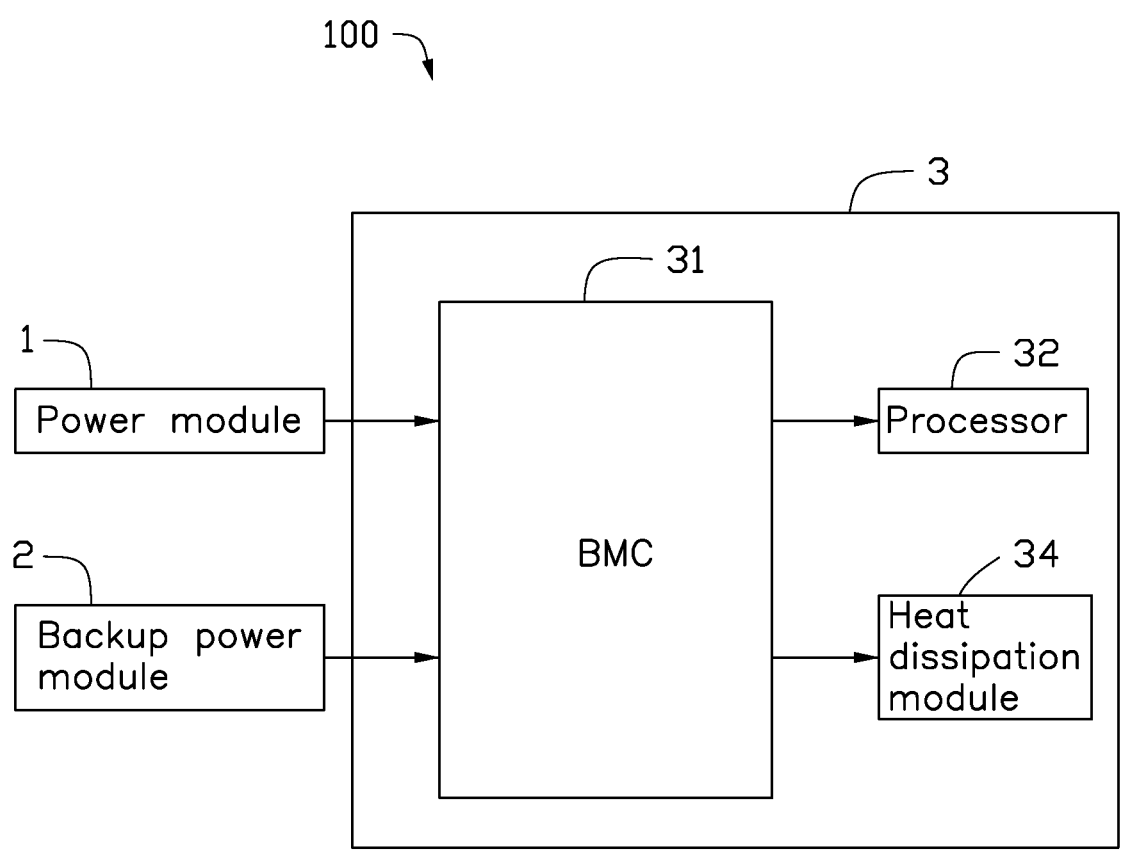
FIG. 1 is a diagram illustrating an embodiment of a management system for server power.
Figure 2:
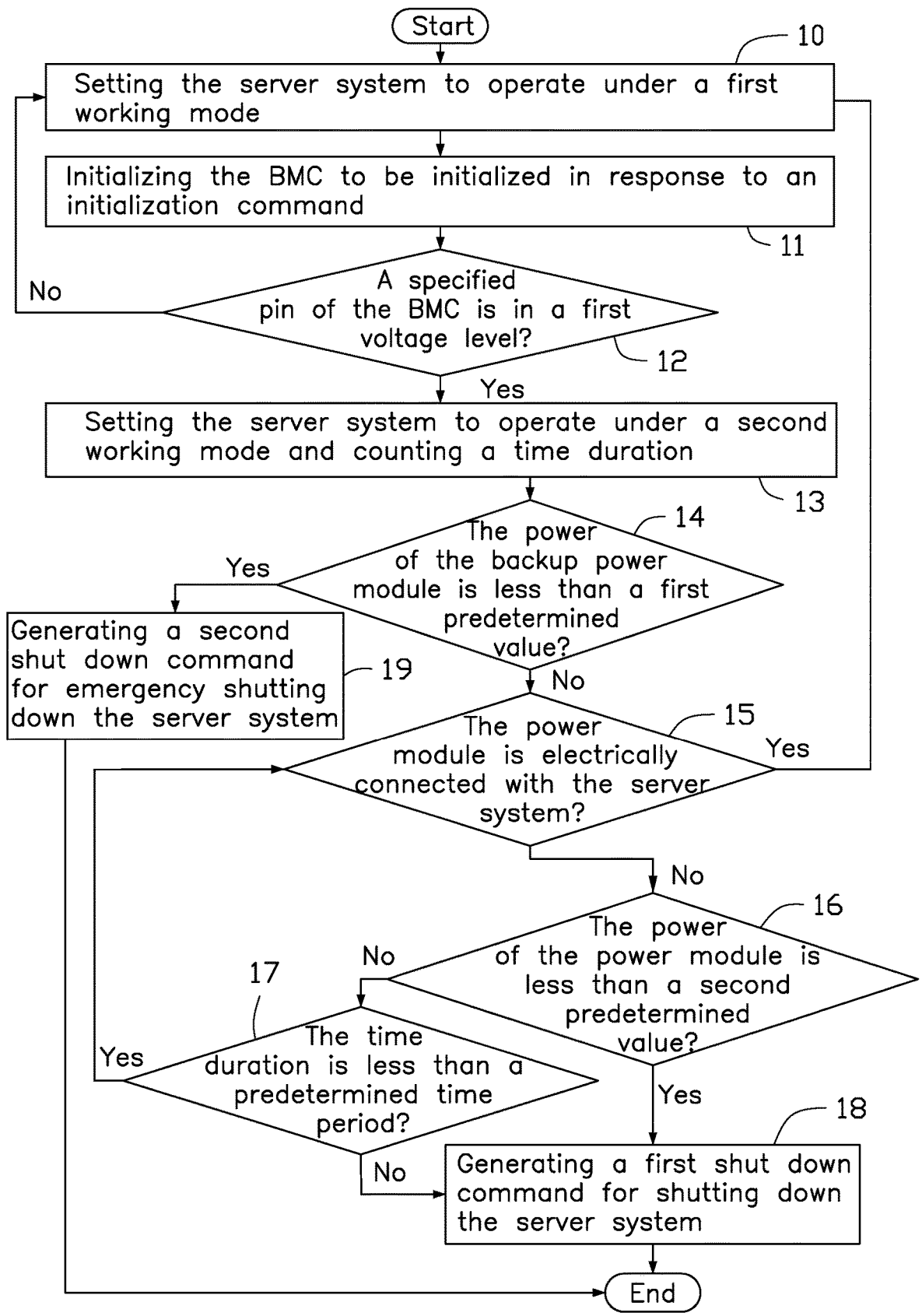
FIG. 2 is a flowchart of a method for the system of FIG. 1.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. The drawings are not necessarily to scale and the proportions of certain parts may be exaggerated to better illustrate details and features. The description is not to be considered as limiting the scope of the embodiments described herein.

In general, the word "module," as used herein, refers to logic embodied in hardware or firmware, or to a collection of software instructions, written in a programming language, for example, Java, C, or assembly. One or more software instructions in the modules may be embedded in firmware, such as an EPROM, magnetic, or optical drives. It will be appreciated that modules may comprise connected logic units, such as gates and flip-flops, and may comprise programmable units, such as programmable gate arrays or processors, such as a CPU. The modules described herein may be implemented as either software and/or hardware modules and may be stored in any type of computer-readable medium or other computer storage systems. The term "comprising" means "including, but not necessarily limited to"; it specifically indicates open-ended inclusion or membership in a so-described combination, group, series, and the like. The disclosure is illustrated by way of example and not by way of limitation in the figures of the accompanying drawings in which like references indicate similar elements. It should be noted that references to "an" or "one" embodiment in this disclosure are not necessarily to the same embodiment, and such references can mean "at least one."

The present disclosure describes a system for managing power to a server for improving a stability of running the system.

FIG. 1 shows an embodiment of a server power management system 100. The sever power management system 100 includes a power module 1, a backup power module 2, and a server system 3. The power module 1 and the backup power module 2 are electrically connected to the server system 3 through a power distribution board PDB. In one embodiment, the power module 1 provides alternating current, and the backup power module 2 is a battery. In one embodiment, the server system 3 can communicate with terminal devices. In one embodiment, a protocol for such communication can be a Hyper Text Transfer Protocol (HTTP), or a Hyper Text Transfer Protocol over Secure Socket Layer (HTTPS), but not being limited hereto. In one embodiment, the server system 3 can be a single server, or can be a group of servers with different functions. The terminal devices can be a movable terminal with a networking function, such a personal computer, a tablet, a smart phone, a personal digital assistant (PDA), a games machine, an internet protocol television (IPTV), a smart wearable device, or a navigator. The terminal devices can be a fixed terminal with a networking function, such as a desktop computer or a digital television. The server system 3 includes a baseboard management controller (BMC) 31, a processor 32, and a heat dissipation module 34. The BMC 31 includes a plurality of input/output pins. The BMC 31 is electrically connected with the processor 32 and the heat dissipation module 34. The processor 32 includes at least one processor. The processor 32 stores program codes used to execute different functions. The processor 32 is a central processing unit (CPU), or a large scale integrated circuit, being an operating core and a control core. In other embodiments, the server system 3 can further include a display, a storage, a connector, and an optical driver, but not being limited thereto. The method may comprise at least the following steps, which may be in different order:

In Step 10, the server system 3 is set to operate under a first working mode.

In one embodiment, in the first working mode, the server system 3 is powered by the power module 1. The processor 32 is operated under a first clock frequency, and the heat dissipation module 34 is driven under a first driving rate. Under the first clock frequency, a driving power of the processor 32 is adjusted in a first predetermined range based on different number of loads. The first predetermined range is from 370 watts (W) to 750 W. In one embodiment, the driving power of the processor 32 is 505.82 W.

In Step 11, the BMC 31 is initialized in response to an initialization command.

In one embodiment, the BMC 31 executes different functions, and sends control signals to other elements connected with the BMC 31, such as the processor 32 and the heat dissipation module 34.

In Step 12, it is determined whether a specified pin of the BMC 31 is at a first voltage level.

In one embodiment, the BMC 31 includes a plurality of input/output pins. In one embodiment, the input/output pins are general-purpose input/output (GPIO) pins. One of the input/output pins is used as the specified pin, and electrically connected with the power module 1 and the backup module 2. Each of the power module 1 and the backup module 2 include a specified detection pin. In one embodiment, the specified detection pin is an alert pin. When the power module 1 is working normally, the specified detection pin of the power module 1 is at a second voltage level. When the power module 1 is not working normally, the specified detection pin of the power module 1 is at the first voltage level. When the backup power module 2 is working normally, the specified detection pin of the backup power module 2 is at a second voltage level. When the backup power module 2 is not working normally, the specified detection pin of the backup power module 2 is at the first voltage level. In one embodiment, the first voltage level is a low voltage level (logic low), and the second voltage level is a high voltage level (logic high).

In Step 13, the server system 3 is set to operate under a second working mode and a time duration is counted during which the specified pin of the BMC 31 is at the first voltage level.

In one embodiment, under the second working mode, the server system 3 is powered by the backup power module 2. The processor 32 is operated under a second clock frequency, and the heat dissipation module 34 is operated under a second driving rate. Under the second clock frequency, the driving power of the processor 32 is adjusted in a second predetermined range based on different number of loads. The second predetermined range is from 0 W to 375 W. In one embodiment, the driving power of the processor 32 is 205.822 W. The second clock frequency is less than the first clock frequency, and the second driving rate is less than the first driving rate. Thus, the driving power of the processor 32 under the second working mode is less than the driving power of the processor 32 under the first working mode.

In Step 14, it is determined whether the power of the backup power module 2 is less than a first predetermined value.

In one embodiment, the first predetermined value is a minimum operating power for normal operation of the server system 3. In other embodiments, the minimum power can be 5% or 10% of the maximum power of the backup module 2.

In Step 15, it is determined whether the power module 1 is electrically connected with the server system 3 during the power of the backup power module 2 is larger than or equal to the first predetermined value.

In Step 16, it is determined whether the power of the power module 1 is less than a second predetermined value when the power module 1 is disconnected from the server system 3.

In one embodiment, the second predetermined value is larger than the first predetermined value. In one embodiment, the second predetermined value is 40% of the maximum of the backup power module 2.

When the power module 1 is electrically connected with the server system 3, the process returns to Step 10.

In Step 17, it is determined whether the time duration is less than a predetermined time period when the power of the backup power module 2 is larger than or equal to the second predetermined value.

In one embodiment, the predetermined time period is 3 minutes. In other embodiments, the predetermined time period can be changed for different requirements, but not being limited thereto.

In Step 18, a first shut down command for shutting down the server system 3 is generated when the power of the power module 2 is less than the second predetermined value or when the duration time is larger than or equal to the predetermined time period.

When the duration time is less than the predetermined time period, the process returns to the Step 15.

In one embodiment, the first shut down command is a soft shut down command. The shutting down processes of the server system 3 include, shutting the process executed by the processor 32, storing data in the storage, and disconnecting the server system 3 from the power module 1 and the backup power module 2.

In Step 19, a second shut down command for emergency shutting down the server system 3 is generated when the power of the backup power module 2 is less than the first predetermined value.

In one embodiment, the second shut down command is a hard shut down command. In this process, the server system 3 directly shuts down the connection to the power module 1 and the backup power module 2.

Based on the server power management method, the power of the backup power module 2 is monitored, and the power consumption of the server system 3 is reduced, and the power of the backup power module 2 is saved. Thus, stability of the server system 3 is improved.

Figure 3:
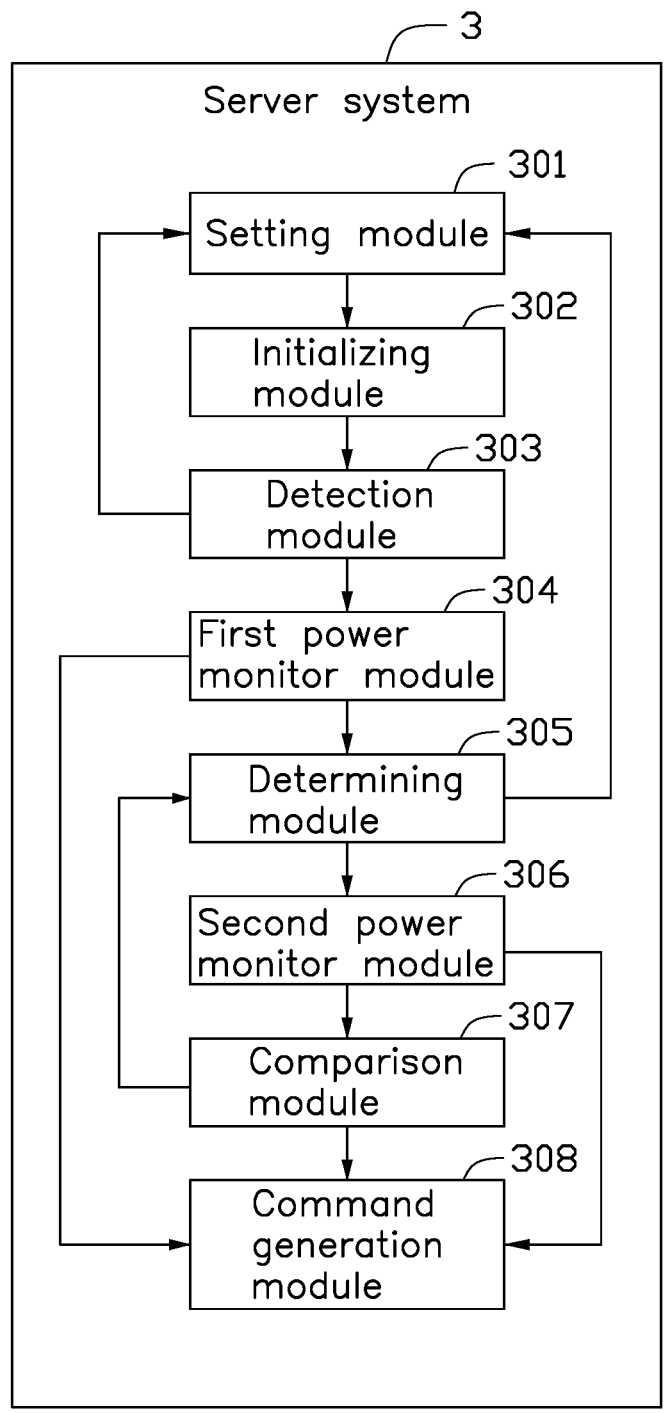
FIG. 3 is a diagram illustrating the server system of FIG. 1.

FIG. 3 shows a diagram of the server system 3.

The server system 3 is electrically connected with the power module 1 and the backup power module 2. In the embodiment, the power module 1 provides alternating current. The backup power module 2 is a battery. In one embodiment, the server system 3 can communicate with a terminal device using a specified protocol. In one embodiment, a protocol for such communication can be a Hyper Text Transfer Protocol (HTTP), or a Hyper Text Transfer Protocol over Secure Socket Layer (HTTPS), but not being limited hereto. In one embodiment, the server system 3 can be a single server, or can be a group of servers with different functions. The terminal device can be a movable terminal with a networking function, such a personal computer, a tablet, a smart phone, a personal digital assistant (PDA), a gaming device, an internet protocol television (IPTV), a smart wearable device, or a navigator. The terminal device can be a fixed terminal with a networking function, such as a desktop computer or a digital television. The server system 3 includes a baseboard management controller (BMC) 31, a processor 32, and a heat dissipation module 34. The BMC 31 includes a plurality of input/output pins. The BMC 31 is electrically connected with the processor 32 and the heat dissipation module 34. The processor 32 includes at least one processor. The processor 32 stores program codes to execute different functions. The processor 32 is a central processing unit (CPU), or a large scale integrated circuit, being an operating core and a control core. In other embodiments, the server system 3 can further include a display, a storage, a connector, and an optical driver, but not being limited thereto.

The server system 3 further includes a setting module 301, an initializing module 302, a detection module 303, a first power monitor module 304, a determining module 305, a second power monitor module 306, a comparison module 307, and a command generation module 308.

The setting module 301 sets the server system 3 to operate under a first working mode.

In one embodiment, in the first working mode, the server system 3 is powered by the power module 1. The processor 32 is operated under a first clock frequency, and the heat dissipation module 34 is driven under a first driving rate. Under the first clock frequency, a driving power of the processor 32 is adjusted in a first predetermined range based on different number of loads. The first predetermined range is from 370 watts (W) to 750 W. In one embodiment, the driving power of the processor 32 is 505.82 W.

The initializing module 302 initializes the BMC 31 by an initialization command.

In one embodiment, the BMC 31 executes different functions, and sends control signals to other elements connected with the BMC 31, such as the processor 32 and the heat dissipation module 34.

The detection module 303 determines whether a specified pin of the BMC 31 is at a first voltage level.

In one embodiment, the BMC 31 includes a plurality of input/output pins. In one embodiment, the input/output pins are GPIO pins. One of the input/output pins is used as the specified pin, and electrically connected with the power module 1 and the backup module 2. Each of the power module 1 and the backup module 2 includes a specified detection pin. In one embodiment, the specified detection pin is an alert pin. When the power module 1 is working normally, the specified detection pin of the power module 1 is at a second voltage level. When the power module 1 is not working normally, the specified detection pin of the power module 1 is at the first voltage level. When the backup power module 2 is working normally, the specified detection pin of the backup power module 2 is at a second voltage level. When the backup power module 2 is not working normally, the specified detection pin of the backup power module 2 is at the first voltage level. In one embodiment, the first voltage level is a low voltage level (logic low), and the second voltage level is a high voltage level (logic high).

The detection module 303 sets the server system 3 to operate under a second working mode and counts a time duration during which the specified pin of the BMC 31 is at the first voltage level.

In one embodiment, under the second working mode, the server system 3 is powered by the backup power module 2. The processor 32 is operated under a second clock frequency, and the heat dissipation module 34 is operated under a second driving rate. Under the second clock frequency, the driving power of the processor 32 is adjusted in a second predetermined range based on different number of loads. The second predetermined range is from 0 W to 375 W. In one embodiment, the driving power of the processor 32 is 205.822 W. The second clock frequency is less than the first clock frequency, and the second driving rate is less than the first driving rate. Thus, the driving power of the processor 32 under the second working mode is less than the driving power of the processor 32 under the first working mode.

The first power monitor module 304 determines whether the power of the backup power module 2 is less than a first predetermined value.

In one embodiment, the first predetermined value is a minimum operating power for normal operation of the server system 3. In other embodiments, the minimum power can be 5% or 10% of the maximum power of the backup module 2.

When the power of the backup power module 2 is larger than or equal to the first predetermined value, the determining module 305 determines whether the power module 1 is electrically connected with the server system 3.

When the power module 1 is disconnected from the server system 3, the second power monitor module 306 determines whether the power of the power module 1 is less than a second predetermined value.

In one embodiment, the second predetermined value is larger than the first predetermined value. In one embodiment, the second predetermined value is 40% of the maximum of the backup power module 2.

When the power of the backup power module 2 is larger than or equal to the second predetermined value, the comparison module 307 determines whether the time duration is less than a predetermined time period.

In one embodiment, the predetermined time period is 3 minutes. In other embodiments, the predetermined time period can be adjusted for different requirements, but not being limited thereto.

When the power of the backup power module 2 is less than the second predetermined value or the duration time is larger than or equal to the predetermined time period, the command generation module 308 generates a first shut down command for shutting down the server system 3.

In one embodiment, the first shut down command is a soft shut down command. The shutting down processes of the server system 3 include shutting the processes executed by the processor 32, storing data in the storage, and disconnecting the server system 3 from the power module 1 and the backup power module 2.

When the duration time is less than the predetermined time period, the determining module 305 determines whether the power module 1 is electrically connected with the server system 3.

When the power of the backup power module 2 is less than the first predetermined value, the command generation module 308 generates a second shut down command for emergency shutting down.

In one embodiment, the second shut down command is a hard shut down command. The server system 3 directly shuts down the connection to the power module 1 and the backup power module 2.

Based on the server power management method, power of the backup power module 2 is monitored, the power consumption of the server system 3 is reduced, and the power of the backup power module 2 is saved. Thus, stability of the server system 3 is improved.

While various and preferred embodiments have been described the disclosure are not limited thereto. On the contrary, various modifications and similar arrangements (as would be apparent to those skilled in the art) are also intended to be covered. Therefore, the scope of the appended claims should be accorded the broadest interpretation so as to encompass all such modifications and similar arrangements.

What is claimed is:

1. A server power management method used in a server power management system, the server power management system comprises a power module, a backup power module, and a server system with at least one server; the server power management method comprising:
   setting the server system to operate under a first working mode;
   initializing a baseboard management controller (BMC) in response to an initialization command;
   determining whether a specified pin of the BMC is at a first voltage level; and
   setting the server system to operate under a second working mode during the specified pin of the BMC is at the first voltage level;
   wherein under the first working mode, the server system is powered by the power module, and a processor in the server system is operated under a first clock frequency; under the second working mode, the server system is powered by the backup power module, and the processor is operated under a second clock frequency; the first clock frequency is larger than the second clock frequency;

the server power management method further comprising:

determining whether a power of the backup power module is less than a first predetermined value;

generating a first shut down command for emergency shutting down of the server system when the power of the backup power module is less than the first predetermined value;

determining whether the power module is electrically connected to the server system when the power of the backup power module is larger than or equal to the first predetermined value;

determining whether the power of the backup power module is less than a second predetermined value when the power module is disconnected from the server system; and generating a second shut down command for a soft shutting down of the server system when the power of the backup power module is less than the second predetermined value; the second predetermined value is larger than the first predetermined value.

2. The server power management method of claim 1, wherein the server power management method further comprises:

counting a time duration when the server system operates under the second working mode;

determining whether the time duration is less than a predetermined time period when the power of the backup power module is larger than or equal to the second predetermined value; and generating the second shut down command when the time duration is larger than or equal to the predetermined time duration.

3. The server power management method of claim 1, wherein the server system further comprises a heat dissipation module; under the first working mode, the heat dissipation module is operated under a first driving rate; under the second working mode, the heat dissipation module is operated under a second driving rate; the first driving rate is larger than the second driving rate.

4. A server power management system comprising:

a power module;

a backup power module; and a server system connected with the power module and the backup power module; the server system with a baseboard management controller (BMC) and a processor comprising:

a setting module configured to set the server system to operate under a first working mode;

an initializing module configured to initialize the BMC in response to an initialization command;

a detection module connected with the BMC and configured to determine whether a specified pin of the BMC is at a first voltage level;

wherein when the specified pin of the BMC is at the first voltage level, the setting module sets the server system to operate under a second working mode; under the first working mode, the server system is powered by the power module, and the processor is operated under a first clock frequency; under the second working mode, the server system is powered by the backup power module, and the processor is operated under a second clock frequency; the first clock frequency is larger than the second clock frequency;

wherein the server power management system further comprises a first power monitor module and a common generation module; the first power monitor module determines whether the power of the backup power module is less than a first predetermined value; the common generation module generates a first shut down command for emergency shutting down of the server system when the power of the backup power module is less than the first predetermined value; and wherein the server power management system further comprises a determining module and a second power monitor module; the determining module determines whether the power module is electrically connected to the server system when the power of the backup power module is larger than or equal to the first predetermined value; the second monitor module determines whether the power of the backup power module is less than a second predetermined value when the power module is disconnected from the server system; the command generation module generates a second shut down command when the power of the backup power module is less than the second predetermined value; the second predetermined value is larger than the first predetermined value.

5. The server power management system of claim 4, wherein the server power management system further comprises a comparison module; the setting module further counts a time duration when the second working mode; the comparison module determines whether the time duration is less than a predetermined time duration when the power of the backup power module larger than or equal to the second predetermined value; the command generation module generates the second shut down command for shutting the server system in a soft manner when the time duration is larger than or equal to the predetermined time duration.

6. The server power management system of claim 4, wherein the server system further comprises a heat dissipation module; under the first working mode, the heat dissipation module is operated under a first driving rate; under the second working mode, the heat dissipation module is operated under a second driving rate; the first driving rate is larger than the second driving rate.

7. The server power management system of claim 4, wherein a driving power of the processor under the first working mode is in a first predetermined range; the first predetermined range is from 370 W to 750 W.

8. The server power management system of claim 4, wherein a driving power of the processor under the second working mode is in a second predetermined range; the second the second predetermined range is from 0 W to 375 W.

* * * * *